United States Patent [19]

Satoh

[11] 4,150,435
[45] Apr. 17, 1979

[54] TAPE RECORDER WITH DISPLAY FUNCTION

[75] Inventor: Ken Satoh, Hachioji, Japan

[73] Assignee: Olympus Optical Co., Ltd., Tokyo, Japan

[21] Appl. No.: 855,561

[22] Filed: Nov. 29, 1977

[30] Foreign Application Priority Data

Nov. 30, 1976 [JP] Japan .................................. 51-143581
Nov. 30, 1976 [JP] Japan .................................. 51-143584

[51] Int. Cl.² .......................... G11B 1/04; G06F 15/02
[52] U.S. Cl. ..................................... 364/705; 360/31; 324/99 D
[58] Field of Search ....................... 364/705; 360/6, 31, 360/73, 137; 116/114 R, 115; 340/248 A, 249

[56] References Cited

U.S. PATENT DOCUMENTS

| 3,892,921 | 7/1975 | Burkowitz | 360/31 X |
| 3,940,679 | 2/1976 | Brandwein et al. | 340/249 X |
| 4,027,231 | 5/1977 | Lohrmann | 340/249 X |

FOREIGN PATENT DOCUMENTS 2340373  2/1975  Fed. Rep. of Germany ........... 364/705

Primary Examiner—Jerry Smith

[57] ABSTRACT

A tape recorder with display function comprises a tape recorder unit, a power source terminal connected to a power source for supplying power to the tape recorder unit, a voltage detector for detecting the voltage of the power source via the power source terminal, and a light emission semiconductor display device for digitally displaying the output of the voltage detector as the voltage of the power source.

6 Claims, 6 Drawing Figures

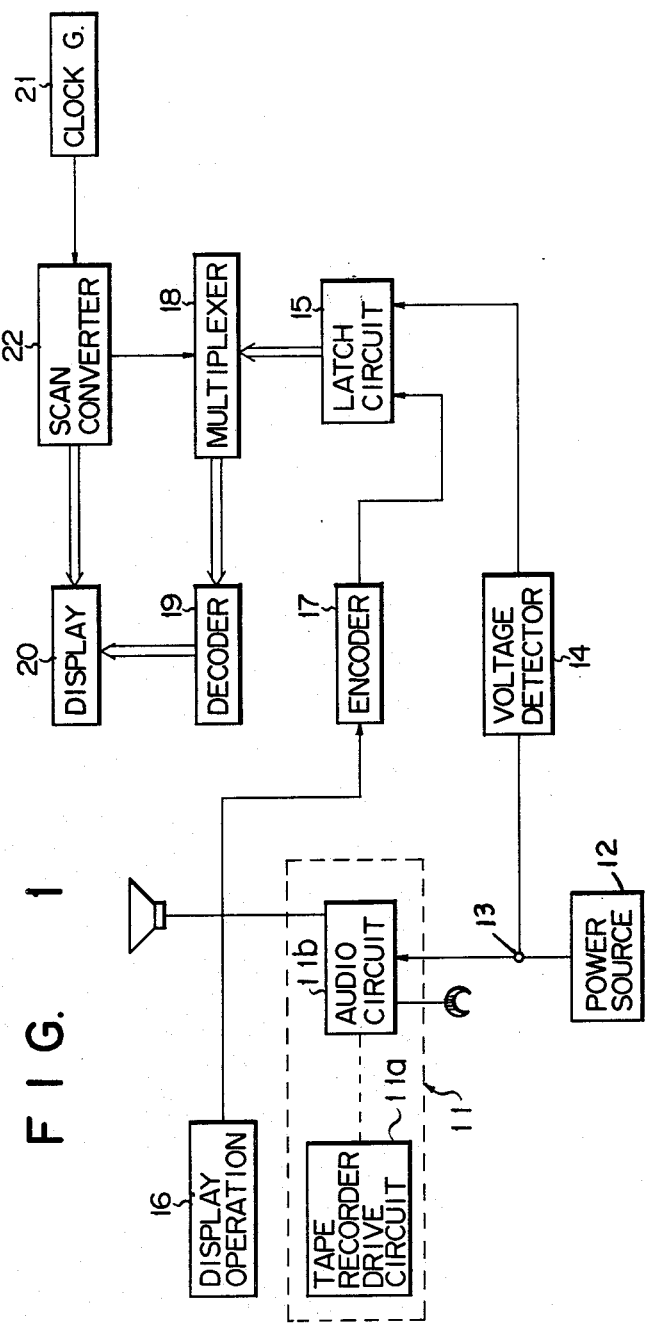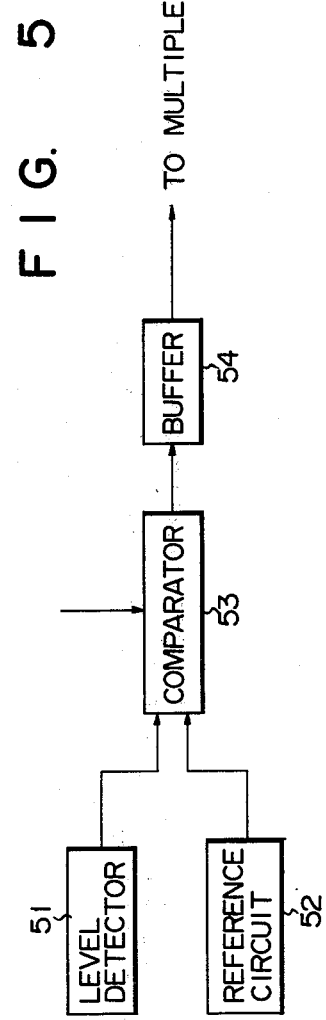

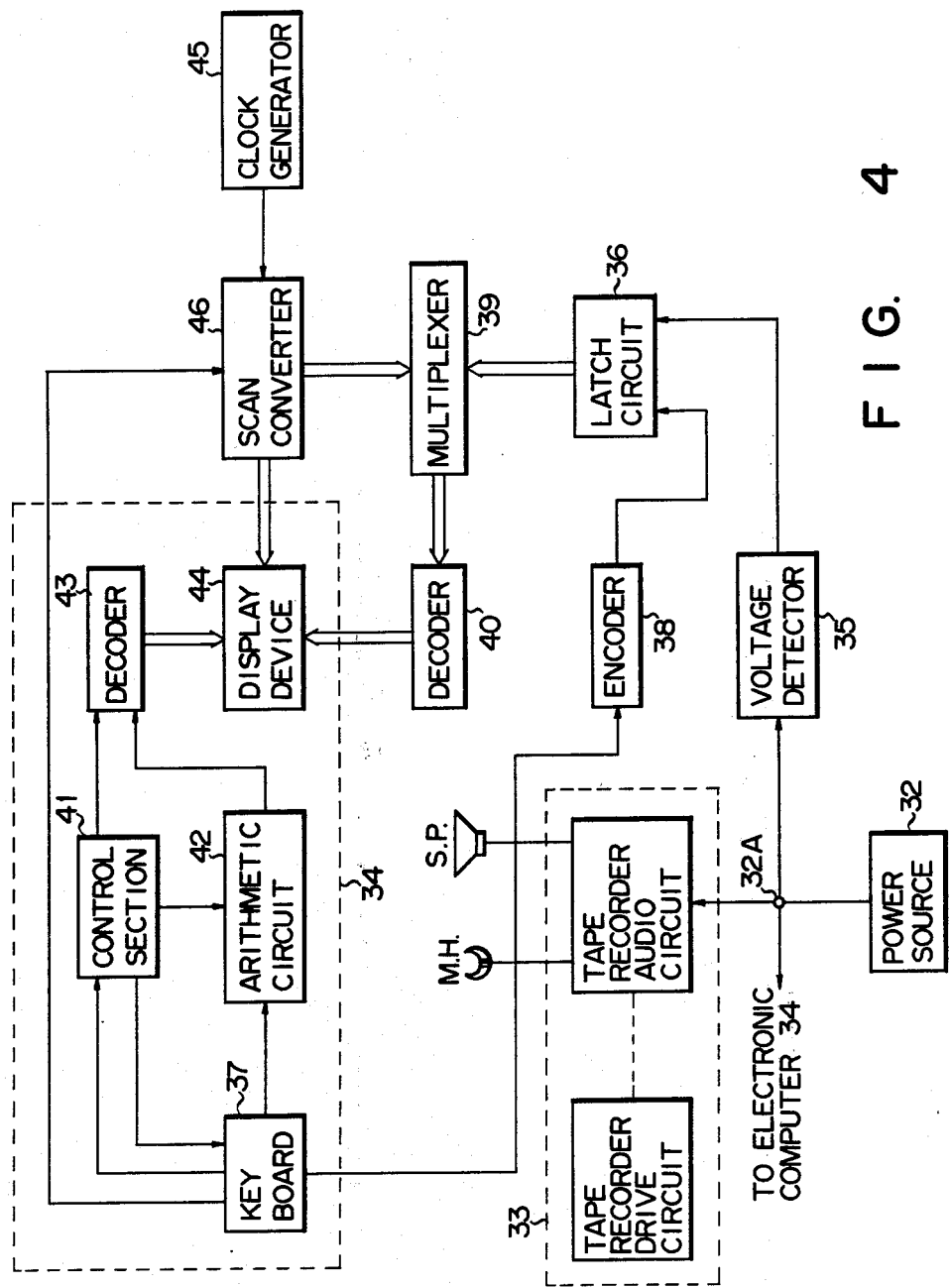
F I G. 4

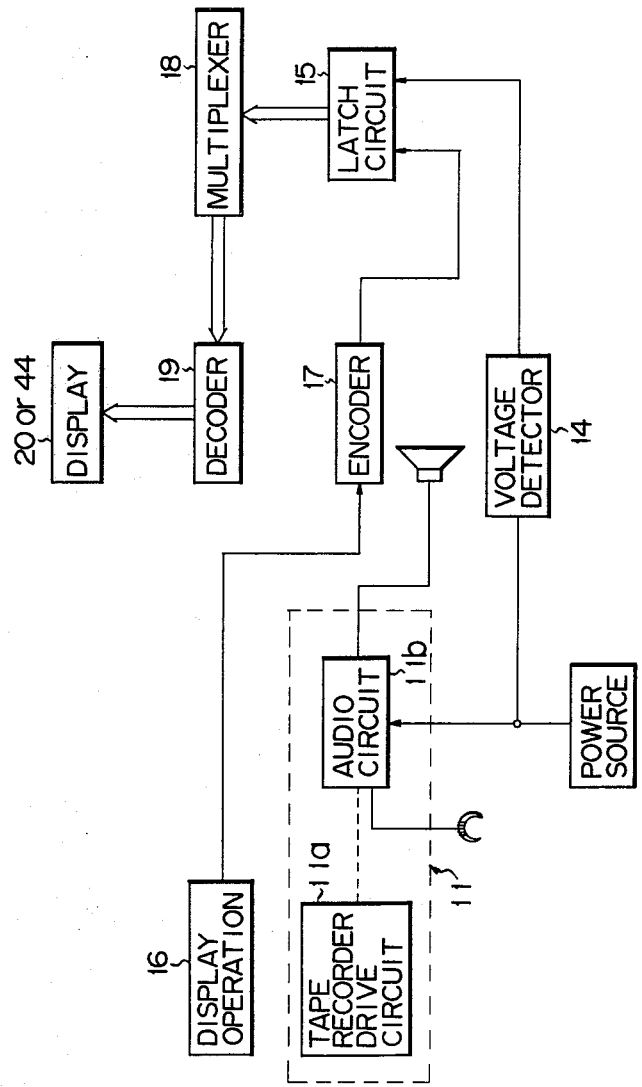
F I G. 6

TAPE RECORDER WITH DISPLAY FUNCTION

BACKGROUND OF THE INVENTION

The present invention relates to a tape recorder with display function for displaying various operational condition of the tape recoder.

There are various types of tape recorders and these tape recorders are equipped with various fittings, for example, a level meter for indicating the record/reproduction level, e.g., a VU meter, and a counter for indicating an amount of travelling of a magnetic tape. As far as we searched, there are few tape recorders with display or indicating means for indicating the voltage of the power source. Particularly, in the case of portable type tape recorder, it uses batteries as its power source so that, if one uses it unnoticing the voltage drop of the power source, he will encounter various abnormalities of tape recorder operation. Therefore, it is desirable that such type tape recorder be provided with display function for displaying the condition of the power source and other operating condition of the tape recorder such as the record/reproduction level. However, there are no tape recorders with such a display function.

SUMMARY OF THE INVENTION

Accordingly, an object of the present invention is to provide a tape recorder with display function which is capable of displaying various operational conditions of a tape recorder.

According to the present invention, there is provided a tape recorder with display function in which the voltage of a power source to supply power to a tape recorder unit and/or record/reproduction level are detected and these pieces of detected information are displayed in a display device.

BRIEF DESCRIPTION OF THE DRAWINGS

The present invention will be better understood from the following description taken in connection with the accompanying drawings, in which:

FIG. 1 shows a block diagram of a tape recorder with display function which is an embodiment of the present invention;

FIG. 4 shows a block diagram of the tape recorder with a desk top calculator shown in FIG. 3;

FIG. 5 shows a circuit diagram of a level detector for detecting record/reproduction level which is used in the FIG. 4 circuit; and FIG. 6 shows a circuit diagram of a tape recorder according to a further another embodiment.

DETAILED DESCRIPTION OF THE PREFERRED EMBODIMENT

Figure 2:
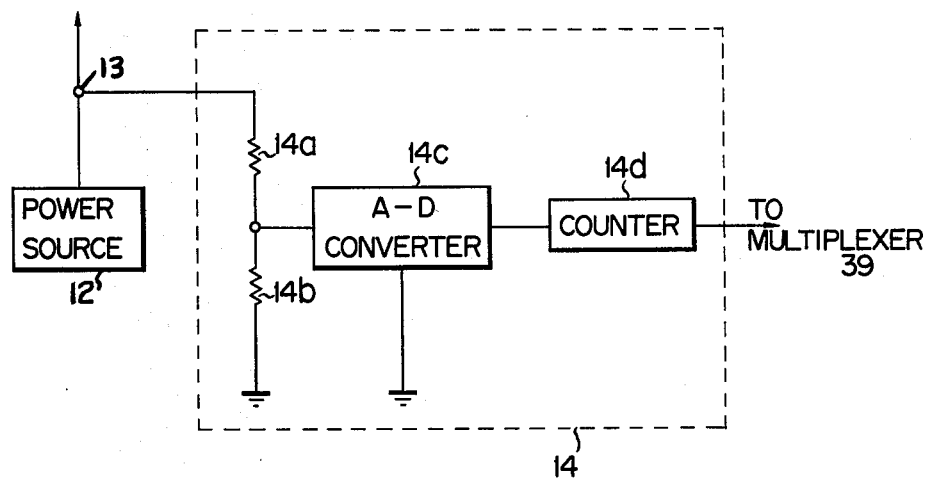
FIG. 2 shows a circuit diagram of a voltage detector circuit used in the tape recorder in FIG. 1.

Referring now to FIG. 1, there is shown an embodiment of a tape recorder according to the present invention. In the figure, a tape recorder unit 11 includes a tape recorder drive circuit 11a and a tape recorder audio circuit 11b. A power source 12 supplies power through a power source terminal 13 to the tape recorder unit 11. The power source 12 is coupled with a voltage detector circuit 14. The details of the voltage detector circuit 14 is shown in FIG. 2. As shown, the voltage detector circuit 14 comprises a voltage dividing circuit including resistors 14a and 14b, an A-D converter 14c coupled with the voltage dividing circuit, and a counter 14d connected to the output of the converter 14c. Turning back to FIG. 1, a latch circuit 15 is connected to the output of an encoder 17 for encoding the operation of an operation key of the tape recorder. The output signal read out from the latch circuit 15 is fed to a multiplexer 18. The output of the multiplexer 18 is applied to a display device 20 comprising light emission diodes (LED) of 7 segments, for example, through a BCD-7-segment decoder 19. The display device is dynamically driven for display when its driver included therein is driven by a synchronizing signal from a scan converter 22 responsive to clock pulses generated by a clock pulse generator 21. The scan converter 22 constituted by, for example, a large scale integrated circuit (LSI) for desk top calculator is coupled with the multiplexer 18 for synchronizing with it.

In operation of the tape recorder with display function shown in FIG. 1, upon operation of a display operation switch 16, the voltage signal of the power source 12 detected by a voltage detector 14 is latched by the latch circuit 15. The voltage of the power source is 5.84V, for example. At the same time, a code signal corresponding to a symbol representing the voltage of the power source 12, for example, E fed from the encoder 17 is latched in the latch circuit 15. The contents of the latch circuit 15 is supplied to a 7-segment decoder 19, through a multiplexer 18. The display signal from the decoder 19 selectively energizes LED segments included in the display device 20, in accordance with a timing signal from the scan converter 22. As a result, the power source voltage is displayed as E 5.84 on the display device 20.

Another embodiment of the invention, in which a display device is applied to a tape recorder with a desk top calculator will now be described.

Figure 3:
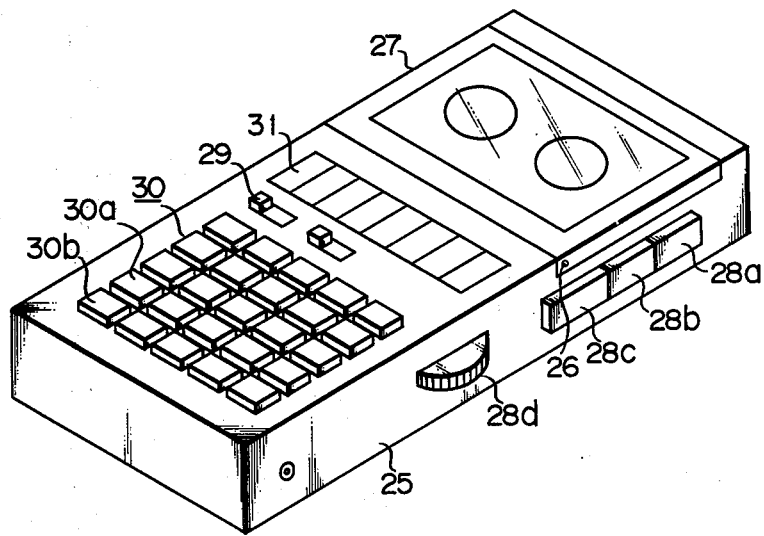
FIG. 3 shows a perspective view of a tape recorder which is another embodiment of the present invention.

Reference will be made to FIG. 3 illustrating the outward appearance of the tape recorder with a desk top calculator. In the FIGURE, a case 25 is provided with a cover 27 hinged thereto. Operational buttons 28a to 28c, and a sound volume knob 28d are operationally attached on the side of the case 25. A power switch 29, a key board 30 and a display panel 31 are observed on the top surface of the case 25.

Turning now to FIG. 4, there is shown a block diagram of a circuit construction of the apparatus shown in FIG. 3. As shown, a power souce 32 supplies power to a recorder unit 33 and a desk top calculator unit 34, through a power source terminal 32A. The terminal 32A is connected to a latch circuit 36 through a voltage detector 35. To the latch circuit 36, a key board 37 of the top desk unit 34 is connected through an encoder 38. The output of the latch circuit 36 is connected through a multiplexer 39 to a BDC-7-segment decoder 40. The output of the key board 37 which is an input unit is coupled with a control circuit 41 and a memory/arithmetic circuit 42. The control circuit 41 and the memory/arithmetic circuit 42 are outputted to a decoder 43 of a display circuit which is an output unit. The output of the decoder 43 is connected to a semiconductor display device 44. The display device is so designed that it dynamically performs a display operation in response to a scanning signal coming from a scan converter 46 connected to the output of a clock generator 45. The display device 44 is also connected to the output of a decoder 40 to display the power source voltage latched in the latch circuit 36.

In operation, the power switch 29 is turned on to supply electric power to units 33 and 34. Then, any one of the buttons 28a to 28d is operated. If it is desired to check the voltage of the power source 32, a related button on the key board 37 of the desk top unit 34, for example, the button 30a, is depressed. Upon the depression of the button, the latch circuit 36 operates to check the power source voltage detected by the voltage detector 35. At this time, the encoder 38 operates to provide data corresponding to E, for example, which is a power source voltage representation, to the latch circuit 36. The contents of the latch circuit 36 is fed to the display circuit 44 through the multiplexer 39 and the decoder 40. Responsive to an output of the key board 37, the display device 44 performs a dynamic display operation by the scanning signal generated from the scan converter 46 so that the power source voltage headed with the mark E, i.e. E 5.84, is displayed.

If one desires to perform an arithmatic or other operation, it is permitted by depression of necessary keys as in the ordinary desk top calculator. In this case, if the power source check is necessary, depression of the key 30a displays the power source voltage on the display panel 31.

As described above, the specific key operation causes the power source voltage to be displayed on the display panel 31 which is used mainly for the calculator. Thus, there is no need for battery check meters and necessary parts for its manufacturing are saved, leading to reduction of its size and economy. Further, power drop of the battery is previously checked so that many useful effects are attained and errors avoided, such as erroneous calculation due to the power drop. Incidentally, improved recent semiconductor technology enables the additional power source voltage detector circuit 35 and the memory/arithmetic circuit 42 to be fabricated in a single chip. For this, addition of these circuits brings about little rise of cost.

Additional display functions may also be incorporated into the tape recorder. Details of this will be given referring to FIG. 5 relating to an example with a record/reproduction level checking function. A record/reproduction magnetic head produces a signal of record or reproduction which in turn is detected by a level detector 51. The detected signal is fed to a comparator 53, together with a reference level signal from a reference level signal generator 52. In the comparator, these signals are compared in accordance with a pregiven program by using a relation $20\log V1/V2$, where V1 is the detected signal level and V2 is the reference signal level. The output of the comparator 53 is loaded into a buffer 54. The output of the buffer 54 is coupled with the multiplexer 39 in FIG. 4. The signal level stored in the buffer 54 is read out in response to the operation of the related key, for example, key 30b, of the key board 37 and is fed to the multiplexer 39 and the decoder 40 and then to the display device 44. As a result, the magnitude of the recording level is displayed by the display device, in terms of the ratio of the recording level to the reference level. That is, one can observe, for example, +3.2 dB or −1.4 dB on the display panel 31.

In the level representation, when the detected recording level is above or below the reference level, merely + or − symbol may be used without numerals. O may be used when these levels are equal. Alternately, only when the detected level exceeds the reference level, it may be expressed by the symbol + and none of representation is given for other level conditions.

Further, for these level displays, some combinations of a plurality of keys may be used for substitution of additionally provided keys exclusively used for the individual level displays. In this case, the keys for the calculator may be used for these level displays without any additional keys having to be used.

In the above-mentioned embodiments use is made of the dynamic display system. But the invention permits the use of a static display system, which eliminates the necessity of providing a clock pulse generator and scan converter, as shown in FIG. 6. In the case of using such dynamic display system, when the display device is operated, the elements of display are energized in turn. This causes intermittent generation of noise signals, which are likely to enter the audio circuit of the tape recorder unit. The use of said static display system, however, prevents such generation of noise signals.

In place of light emission diodes used in the above-mentioned embodiments, liquid crystal, plasma tubes, Nixie tubes may be used for the display means.

As described above, in the tape recorder according to the present invention, the power source voltage and/or the record/reproduction level may be visually observed by properly depressing related keys on the key board. Therefore, the power source condition and/or the record/reproduction level may be easily checked without any deterioration of the desk top calculator function.

What is claimed is:

1. A tape recorder device with display function comprising:

a power source terminal connected to a DC power source; a tape recorder unit connected to said DC power source through said DC power source terminal to supply power;

a desk top calculator unit connected to said DC power source via said power source terminal to receive power from said DC power source, and including a key board, a control circuit, a memory/arithmetic circuit and a display device;

a voltage detector connected to said DC power source via said power source terminal for detecting the voltage of said DC power source;

memory means connected to said voltage detector and said key board for storing the voltage information detected by at least said voltage detector and for reading out the information in response to the operation of at least one key in operation keys included in said key board; and display means connected to said memory means for displaying said read out information in a display device included in said desk top calculator.

2. A tape recorder device with display function according to claim 1, in which said tape recorder unit comprises:

means for generating a record/reproduction signal; a level detector connected to said record/reproduction signal generating means for detecting a record/reproduction level from the record/reproduction signal;

a reference level signal generator for generating a reference level signal;

a comparator/operation circuit connected to the outputs of said level detector and said reference level signal generator in which the record/reproduction level and the reference level are compared and operated to produce information representing the magnitude of the record/reproduction level related to the reference level said information from said comparator/operation circuit being supplied to said display means to display said information.

3. A tape recorder device with display function according to claim 1, in which said voltage detector includes a voltage dividing circuit connected to said DC power source for dividing said DC power source voltage and an A-D converter connected to said voltage dividing circuit for converting the divided voltage of said voltage dividing circuit into corresponding digital signal.

4. A tape recorder device with display function according to claim 1, in which said display device is of a dynamic display type.

5. A tape recorder device with display function according to claim 1, in which said display device is of light emission diode type.

6. A tape recorder device according to claim 1, in which said display device is of a static display type.

* * * * *